(12) United States Patent
Sen et al.

(10) Patent No.: US 10,224,812 B1
(45) Date of Patent: Mar. 5, 2019

(54) SENSING NETWORK MISMATCH COMPENSATION FOR SWITCHING VOLTAGE REGULATOR WITH INPUT VOLTAGE AND CURRENT SENSING

(71) Applicant: Infineon Technologies Austria AG, Villach (AT)

(72) Inventors: Sujata Sen, Marina Del Rey, CA (US); Zhiqing You, Torrance, CA (US); Tim Ng, Monterey Park, CA (US); Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/783,087

(22) Filed: Oct. 13, 2017

(51) Int. Cl.
*H02M 1/00* (2006.01)
*H02M 3/158* (2006.01)
(Continued)

(52) U.S. Cl.
CPC ............. *H02M 3/157* (2013.01); *G05F 1/618* (2013.01); *H02M 3/158* (2013.01); *H02M 7/53875* (2013.01); *H02M 2001/0009* (2013.01)

(58) Field of Classification Search
CPC ......... H02M 2001/0009; H02M 3/158; H02M 7/53875; H02M 2001/0022;
(Continued)

(56) References Cited

U.S. PATENT DOCUMENTS 4,027,227 A 5/1977 Engel
4,278,930 A 7/1981 Rogers
(Continued)

FOREIGN PATENT DOCUMENTS

CN 102263505 A 11/2011
CN 203445784 U 2/2014
(Continued)

OTHER PUBLICATIONS

Pyakuryal, Sudeep et al., "Filter Design for AC to DC Converter", International Refereed Journal of Engineering and Science (IRJES), vol. 2, Issue 6, Jun. 2013, pp. 42-49.
(Continued)

*Primary Examiner* — Gustavo Rosario Benitez
(74) *Attorney, Agent, or Firm* — Murphy, Bilak & Homiller, PLLC

(57) ABSTRACT

A voltage regulator includes a power stage configured to produce an output voltage from an input voltage at an input voltage terminal, a shunt resistor connected in series between the input voltage terminal and the power stage, a first level shifting resistor connected in series between a first terminal of the shunt resistor and a first sense pin of the controller, and a second level shifting resistor connected in series between a second terminal of the shunt resistor and a second sense pin of the controller. The input current of the regulator is sensed as a function of the voltage across the shunt resistor, as shifted down by the level shifting resistors and measured across the sense pins. The input voltage of the regulator is sensed as a function of the current flowing through either one of the level shifting resistors, as measured at one of the sense pins.

28 Claims, 7 Drawing Sheets

(51) Int. Cl.
*H02M 3/157* (2006.01)
*G05F 1/618* (2006.01)
*H02M 7/5387* (2007.01)

(58) Field of Classification Search
CPC .......... H02M 2001/0025; H02M 3/06; G01R 19/0023; G01R 19/0069; G05F 1/618
See application file for complete search history.

(56) References Cited

U.S. PATENT DOCUMENTS

| | | | |
|---|---|---|---|
| 4,309,650 A | 1/1982 | Boros et al. | |
| 4,811,184 A | 3/1989 | Koninsky et al. | |
| 5,889,387 A | 3/1999 | Massie | |
| 5,900,714 A | 5/1999 | Dubhashi et al. | |
| 6,184,660 B1 | 2/2001 | Hatular | |
| 6,294,904 B1 | 9/2001 | Hirst | |
| 6,424,129 B1 | 7/2002 | Lethellier | |
| 7,629,787 B2 | 12/2009 | Lu | |
| 7,695,189 B2* | 4/2010 | Lim | G01K 15/00 327/512 |
| 8,120,336 B2 | 2/2012 | Mehas et al. | |
| 8,125,188 B2* | 2/2012 | Doll | H02J 7/0024 320/134 |
| 8,710,810 B1 | 4/2014 | McJimsey et al. | |
| 9,780,763 B1 | 10/2017 | Lu et al. | |
| 9,941,894 B1* | 4/2018 | Gu | H03M 1/0827 |
| 2005/0071116 A1* | 3/2005 | Kim | G01K 3/005 702/132 |
| 2005/0248477 A1* | 11/2005 | Jongsma | H03M 1/1076 341/110 |
| 2006/0001408 A1 | 1/2006 | Southwell et al. | |
| 2006/0267687 A1 | 11/2006 | Gammie et al. | |
| 2007/0013350 A1 | 1/2007 | Tang et al. | |
| 2007/0046281 A1 | 3/2007 | Domingo et al. | |
| 2007/0241763 A1 | 10/2007 | Panhofer | |
| 2009/0201086 A1 | 8/2009 | Kindt et al. | |
| 2009/0261795 A1 | 10/2009 | Tang et al. | |
| 2009/0306914 A1 | 12/2009 | Cohen | |
| 2010/0007217 A1* | 1/2010 | Steele | H02J 1/102 307/131 |
| 2010/0052611 A1 | 3/2010 | Lyle, Jr. | |
| 2010/0231187 A1 | 9/2010 | Wicht et al. | |
| 2010/0277142 A1* | 11/2010 | Tan | H02M 7/53803 323/268 |
| 2011/0114842 A1* | 5/2011 | Ji | G01S 7/4868 250/340 |
| 2012/0062240 A1 | 3/2012 | Nishijima et al. | |
| 2012/0194258 A1 | 8/2012 | Nien et al. | |
| 2012/0281433 A1 | 11/2012 | Yamanaka | |
| 2013/0135047 A1 | 5/2013 | Danioni et al. | |
| 2013/0193879 A1 | 8/2013 | Sadwick et al. | |
| 2013/0194839 A1 | 8/2013 | Barbati et al. | |
| 2013/0342273 A1* | 12/2013 | Petrie | H03F 3/45623 330/253 |
| 2014/0052394 A1 | 2/2014 | Sun | |
| 2014/0077741 A1 | 3/2014 | Kumagai et al. | |
| 2014/0159734 A1 | 6/2014 | Knill et al. | |
| 2014/0312818 A1 | 10/2014 | Furuchi | |
| 2014/0354303 A1 | 12/2014 | Harrison | |
| 2015/0015160 A1 | 1/2015 | Angelin et al. | |
| 2015/0061407 A1* | 3/2015 | Sen | H03K 19/00369 307/113 |
| 2015/0089253 A1 | 3/2015 | Doering et al. | |
| 2015/0146328 A1 | 5/2015 | Mikami et al. | |
| 2015/0346758 A1 | 12/2015 | Sakakibara | |
| 2016/0149489 A1 | 5/2016 | Tang et al. | |
| 2016/0268899 A1 | 9/2016 | Rader et al. | |
| 2016/0291631 A1 | 10/2016 | Sen et al. | |
| 2018/0219482 A1* | 8/2018 | You | H02M 3/158 |

FOREIGN PATENT DOCUMENTS

| | | |
|---|---|---|
| GB | 2470214 A | 11/2010 |
| JP | 2002051540 A | 2/2002 |

OTHER PUBLICATIONS

You, Zhiqing et al., "Voltage and Current Sensing Calibration for Switching Voltage Regulators", Specification of U.S. Appl. No. 15/421,460, pp. 1-30.

* cited by examiner

SENSING NETWORK MISMATCH COMPENSATION FOR SWITCHING VOLTAGE REGULATOR WITH INPUT VOLTAGE AND CURRENT SENSING

TECHNICAL FIELD

The present application relates to switching voltage regulators with input voltage and current sensing, in particular sensing network mismatch compensation for switching voltage regulators with input voltage and current sensing.

BACKGROUND

Switching voltage regulators generate an output voltage from an input voltage and are implemented with active components such as a pulse width modulation controller (PWM), driver, power MOSFETs, and passive components such as inductors, transformers or coupled inductors, capacitors, and resistors. Controllers typically measure the output current and output voltage in order to regulate and monitor the output voltage. Measuring the input current and input voltage allow the controller to improve regulation and monitoring, as well as monitoring input power for voltage, current, and power constraints.

Knowledge of the regulator input current and voltage is required in some controllers for improved regulation algorithms and monitoring input power for voltage, current, and power constraints. Measuring the input current and voltage requires external and internal circuitry in the controller. For example, some regulator controllers differentially sense a small signal biased with a high DC common mode voltage such as measuring the DCR drop across an input inductor. Matched resistors are typically used in this case to level shift the high bias to voltages at a level the controller can tolerate. However, due to the large drop in voltage, any mismatch in resistance between the level shifting resistors can cause offset issues. Also, due to the small input signal levels, a high gain input stage is needed.

However, this limits the amount of offset the input stage can tolerate before the ADC (analog-to-digital conversion) conversion range of the input stage saturates. In a typical application of measuring a 2 milliohm input current using a sense resistor biased at 12V, resistance tolerance better than 0.1% is required. Also, prior to the resistors being put down on the system board, the sign and magnitude of the mismatch cannot be determined. This means the system must be designed such that enough ADC range is provided to allow for resistor mismatch in both polarities. In addition, high precision resistors are very expensive. For example, resistors with 0.1% precision cost more than 10 times resistors with 1% precision.

Hence, there is a need for an improved input current and voltage monitoring technique for switching voltage regulators which minimizes regulator complexity and cost.

SUMMARY

According to an embodiment of a voltage regulator, the voltage regulator comprises: an input voltage terminal; a power stage configured to produce an output voltage from an input voltage at the input voltage terminal; a controller operable to control switching of the power stage to regulate the output voltage; a shunt resistor connected in series between the input voltage terminal and the power stage; a first level shifting resistor connected in series between a first terminal of the shunt resistor and a first sense pin of the controller; and a second level shifting resistor connected in series between a second terminal of the shunt resistor and a second sense pin of the controller. The controller comprises sense circuitry operable to sense the input current of the regulator as a function of the voltage across the shunt resistor as measured across the sense pins, and sense the input voltage of the regulator as a function of the current measured at one of the sense pins. The controller further comprises calibration circuitry operable to internally compensate for a resistance mismatch between the first and the second level shifting resistors. The calibration circuitry provides the means to make a measurement to determine the sign and magnitude of the offset caused by the resistance mismatch, and the means to introduce an additional compensating offset in order to minimize the overall offset in the measurement.

According to an embodiment of method of sensing input current and voltage of a voltage regulator that includes an input voltage terminal, a power stage for producing an output voltage from an input voltage at the input voltage terminal, a shunt resistor connected in series between the input voltage terminal and the power stage, a first level shifting resistor connected in series between a first terminal of the shunt resistor and a first sense pin of the controller, and a second level shifting resistor connected in series between a second terminal of the shunt resistor and a second sense pin of the controller, the method comprises: sensing the input current of the regulator as a function of the voltage across the shunt resistor as measured across the sense pins; sensing the input voltage of the regulator as a function of the current measured at one of the sense pins; and internally compensating within the controller for a resistance mismatch between the first and the second level shifting resistors.

According to an embodiment of a voltage regulator controller, the controller comprises: a first sense pin configured for series connection to a first level shifting resistor connected to a first terminal of a shunt resistor; a second sense pin configured for series connection to a second level shifting resistor connected to a second terminal of the shunt resistor; sense circuitry operable to sense input current as a function of voltage across the shunt resistor as measured across the sense pins, and sense input voltage as a function of current measured at one of the sense pins; and calibration circuitry operable to internally compensate for a resistance mismatch between the first and the second level shifting resistors.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide sensing network mismatch compensation for switching voltage regulators with input voltage and current sensing. The PI sensing network is external to the regulator controller, and includes a low ohmic high-side shunt resistor connected to the input power rail of the regulator. The voltage across the shunt resistor is proportional to the regulator input current. Level shifting is accomplished by two high ohmic series resistors connected to the terminals of the shunt resistor. The other terminals of the level shifting resistors are connected to respective sense (input) pins on the regulator controller. The regulator controller forces a current through the level shifting resistors such that the voltage across the controller sense (input) pins is dependent on the voltage across the shunt resistor, but level shifted to a lower voltage which does not exceed the maximum voltage permitted at the sense pins. The controller includes sense circuitry that senses (1) the input voltage as a function of the current through the two sense (input) pins and (2) the input current as a function of the voltage across the two sense (input) pins. The controller also includes calibration circuitry that internally compensates for the resistance mismatch between the external level shifting resistors, and for the internal offset of the controller sense circuitry.

Figure 1:
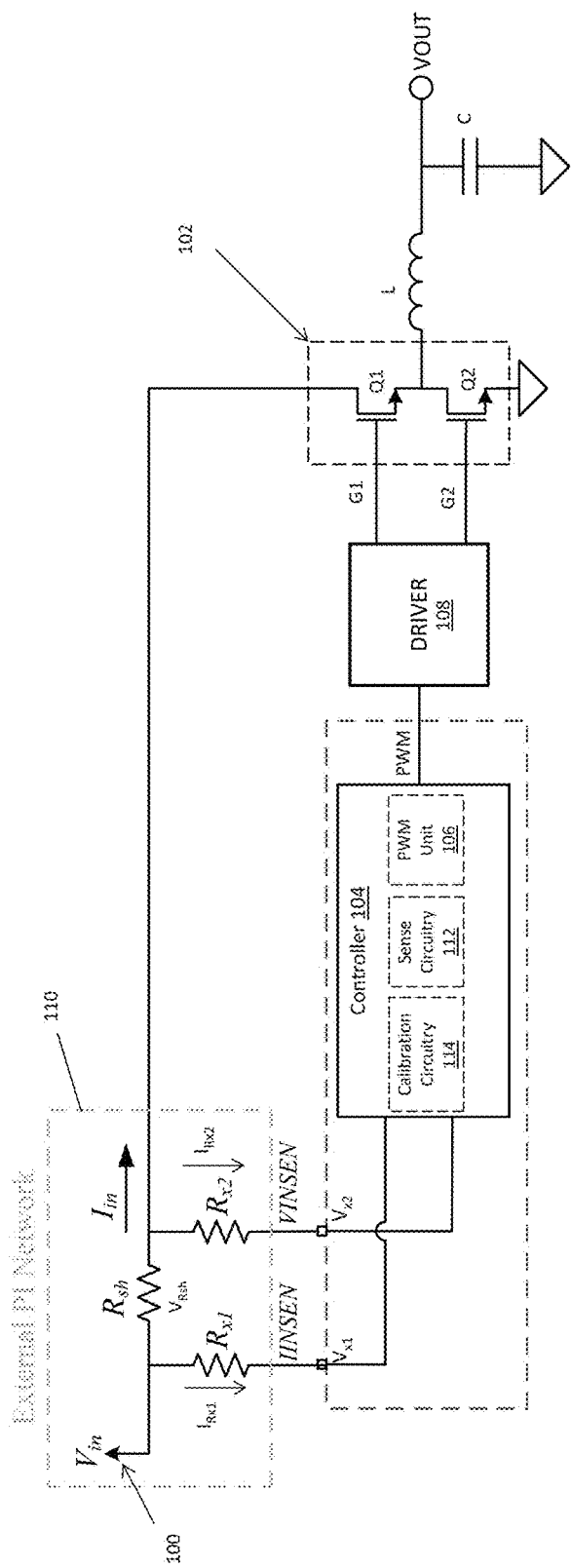
FIG. 1 illustrates a block diagram of an embodiment of a voltage regulator having a controller with calibration circuitry for providing external mismatch and internal offset compensation.

FIG. 1 illustrates an embodiment of a voltage regulator. The voltage regulator comprises an input voltage terminal 100, a power stage 102 configured to produce an output voltage (Vout) from an input voltage (Vin) at the input voltage terminal 100, and a controller 104 such as a microcontroller, microprocessor, ASIC (application-specific integrated-circuit), etc. configured to control switching of the power stage 102. The power stage 102 is connected to an external load (not shown) through an inductor (L) and a capacitor (C) in FIG. 1. Alternatively, the power stage 102 can be coupled to the load through a transformer or coupled inductors. In each case, the power stage 102 has one or more phases coupled to the load. In the embodiment of FIG. 1, each phase includes a high-side transistor (Q1) and a low-side transistor (Q2) for coupling the power stage 102 to the load. The high-side transistor Q1 switchably connects the load to the input voltage rail (Vin) of the voltage regulator, and the corresponding low-side transistor Q2 switchably connects the load to ground at different periods. The power stage 102 is shown with one phase in FIG. 1 for ease of illustration. In general, the power stage 102 can include any desired number of phases including one phase (single-phase implementation) or more than one phase (multi-phase implementation). The load powered by the voltage regulator can be a high-performance integrated circuit such as a microprocessor, graphics processor, network processor, etc. or other type of integrated circuit requiring voltage regulation such as a POL (point-of-load).

The regulator controller 104 regulates the voltage (Vout) delivered to the load by the power stage 102, by adjusting the current delivered to the load. The controller 104 can include a pulse width modulator (PWM) unit 106 for switching the transistors Q1, Q2 of the power stage 102 via a corresponding PWM control signal (PWM) so that the power stage 102 sources or sinks current to the load. Driver circuitry 108 included in or associated with the power stage 102 provides respective gate drive signals G1, G2 to the gates of the high-side and low-side transistors Q1, Q2 of the power stage 102 in response to the PWM control signals provided by the controller 104. The activation state of each power stage phase and the duty cycle of the corresponding high-side and low-side transistors Q1, Q2 are determined at least in part based on the output voltage (Vout) applied to the load, so that the voltage regulator can react as quickly and reliably as possible to changing load conditions.

The controller 104 can manage changes from one reference voltage to another. The controller 104 can also determine errors between the output voltage (Vout) and a reference voltage, and convert the error voltage into a digital representation provided to the PWM unit 106 of the controller 104 for modifying the switching cycle of power stage transistors Q1, Q2 e.g. by adjusting the duty cycle. Such voltage regulation functions are standard in typical digitally-controlled switching voltage regulators, and therefore no further explanation is given in this regard.

In addition to regulating the voltage delivered to the load, the controller 104 also senses the input voltage and input current internally without the use of external amplifiers and without the controller 104 having to connect to voltages exceeding its maximum voltage ratings, even though the regulator input voltage rail Vin (e.g. 12V) may be significantly higher than the internal supply rail (e.g. 3.3 V) of the controller 104. To this end, the controller 104 measures both the input voltage and input current using an external PI network 110.

The external PI network 110 includes a low ohmic shunt resistor (Rsh) and a pair of high ohmic level shifting series resistors (Rx1, Rx2). The voltage ($V_{Rsh}$) across the shunt resistor Rsh is a function or representation of the input current (Iin). Each level shifting resistor Rx1, Rx2 connects one terminal of the shunt resistor Rsh to a sense (input) pin (IINSEN, VINSEN) of the controller 104, to allow sense circuitry 112 of the controller 104 to measure the input voltage and input current. In one embodiment, the sense circuitry 112 measures the input voltage and input current by providing a bias current to the sense pins IINSEN, VINSEN. The level shifting resistors Rx1, Rx2 allow the high voltage input current to be level shifted to an appropriate input voltage to the controller 104. This way, the maximum voltage permitted at the sense pins IINSEN, VINSEN is not exceeded even though the regulator input voltage rail is higher than the maximum voltage of the sense pins. For example, the input voltage may be 12V and the maximum voltage permitted at the sense pins IINSEN, VINSEN may be 1.5V to 2V. The level shifting resistors Rx1, Rx2 draw a current to drop the input voltage Vin to a voltage level no greater than 1.5V to 2V, but still provide the voltage $V_{Rsh}$ across the shunt resistor Rsh at the sense pins IINSEN, VINSEN of the controller 104.

The shunt resistor Rsh included in the external PI network 110 preferably has a resistance in the milli to micro Ohm range. The shunt resistor Rsh is lossy in that it lowers system efficiency by slightly reducing the input voltage rail for the power stage 102 as given by $Power_{loss}=Iin^2*R_{sh}$. However, by using a shunt resistor Rsh having a resistance in the milli to micro Ohm range, the voltage drop ($V_{Rsh}$) across the input voltage rail Vin of the regulator is minimized and therefore the power loss ($Power_{loss}$) also is minimized. For example, the voltage drop $V_{Rsh}$ across the shunt resistor Rsh is about 5 mV for a shunt resistance in the micro Ohm range.

In contrast to the shunt resistor Rsh, the level shifting resistors Rx1, Rx2 should be high ohmic to minimize power loss from the input voltage rail Vin as given by $Power_{loss}=(Vin-Vinsense)^2/R_x$ where Vinsense is the voltage measured at one of the controller sense pins IINSEN, VINSEN and Rx is the level shifting resistor that connects that sense pin to a terminal of the shunt resistor Rsh. Voltage Vinsense can be measured via either level shifting resistor Rx1, Rx2. The level shifting resistors Rx1, Rx2 can have high precision (e.g. 0.1%) or be less precise (e.g. 1%). The level shifting resistors Rx1, Rx2 typically have a resistance which is orders of magnitude higher than that of the shunt resistor Rsh e.g. preferably in the mega Ohm range. Each of the resistors Rsh, Rx1, Rx2 included in the external PI network 110 can comprise one or more individual resistors. For example, each level shifting resistor Rx1, Rx2 can be implemented as a single physical resistor, a plurality of high ohmic discrete resistors connected in series, or a plurality of low ohmic discrete resistors connected in parallel.

Utilizing the external PI network 110 described above and illustrated in FIG. 1, the sense circuitry 112 included in the controller 104 senses the input current (Iin) of the regulator as a function of the voltage $V_{Rsh}$ across the shunt resistor as given by $Iin=f(V_{Rsh})$, as shifted down by the level shifting resistors Rx1, Rx2 and measured across the sense pins IINSEN, VINSEN of the controller 104 as a function of Vinsense=Vx1−Vx2. The sense circuitry 112 also can sense the input voltage Vin of the regulator as a function of the current ($I_{Rx1}$, $I_{Rx2}$) flowing through either one of the level shifting resistors Rx1, Rx2 as given by $Vin=f(I_{RxN})$, as measured at the corresponding sense pin IINSEN, VINSEN of the controller 104.

The controller 104 also includes calibration circuitry 114 that internally compensates for a resistance mismatch between the level shifting resistors Rx1, Rx2, and for the internal offset of the sense circuitry 112. This way, less costly resistors with lower precision (e.g. 1%) can be used without adversely impacting the overall sensing capability of the controller sense circuitry 112. In an embodiment, the sense circuitry 112 includes ADC circuitry for digitizing the sense input current and voltage. The ADC circuitry has limited range. Mismatch between the level shifting resistors Rx1, Rx2 reduces the useful ADC range by a corresponding amount. The calibration circuitry 114 compensates for this mismatch e.g. by changing sense points of an amplifier included in the sense circuitry 112, so that the ADC range of the sense circuitry 112 is decreased marginally, if at all. The calibration circuitry 114 can also internally compensate for the internal offset of the ADC circuitry and other components of the sense circuitry 112 such as amplification circuitry.

Figure 2:
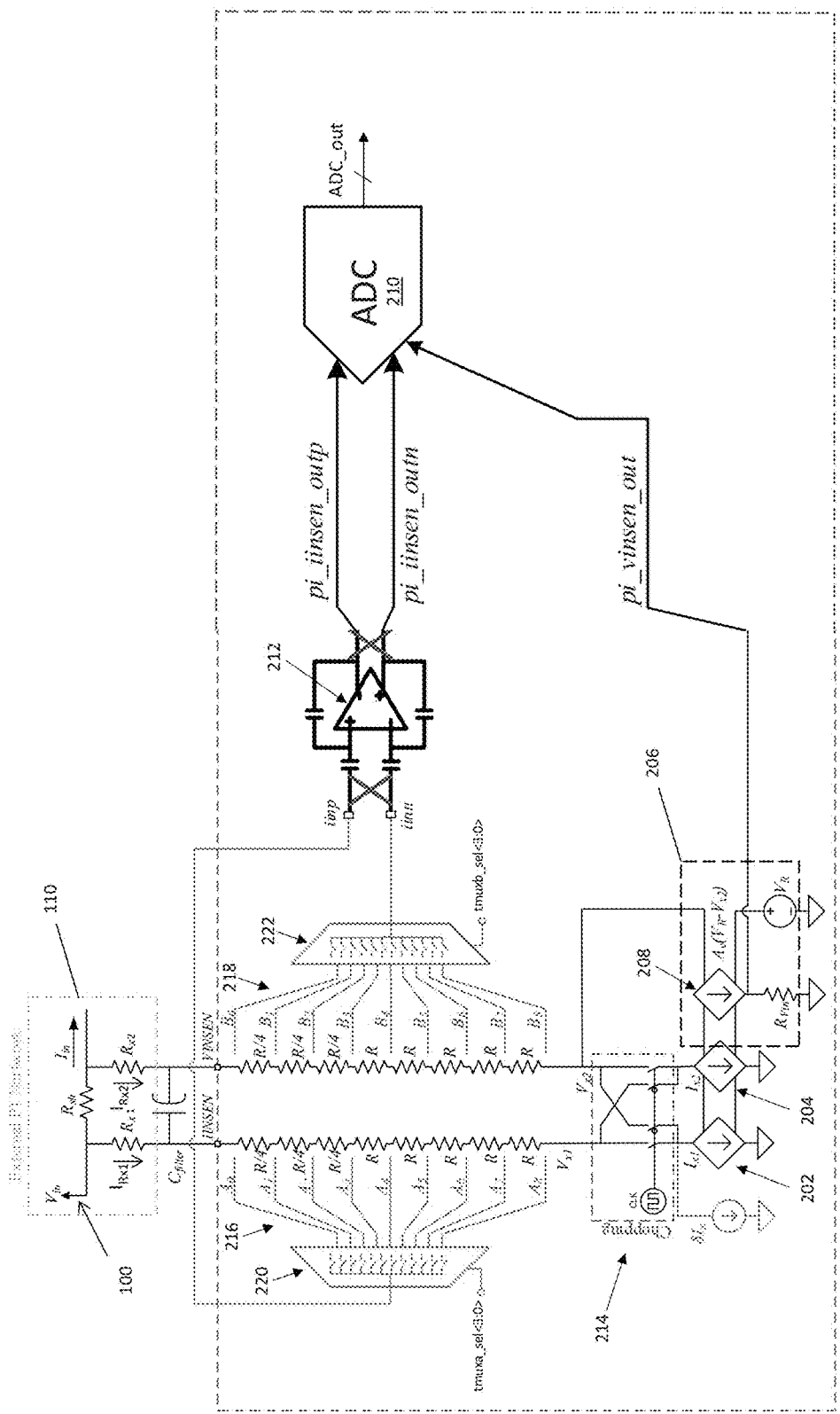
FIG. 2 illustrates a block diagram of an embodiment of the calibration circuitry included in the regulator controller.

FIG. 2 illustrates an embodiment of the sense circuitry 112 and the calibration circuitry 114 included in the regulator controller 104. According to this embodiment, the sense circuitry 112 includes matched current mirrors 202, 204 each of which sinks current (Ix1, Ix2) through the corresponding level shifting resistor Rx1, Rx2 such that the voltage drop (Vx1, Vx2) across the level shifting resistors Rx1, Rx2 is substantially the same and the voltage across the sense pins (Vinsense=Vx1−Vx2) substantially matches the voltage ($V_{Rsh}$) across the shunt resistor Rsh. The controller 104 can sense the input current by using the matched current sources 202, 204 at both input pins IINSEN, VINSEN such that Ix1=Ix2. The voltage drop across both external level shifting resistors Rx1, Rx2 is the same such that the voltage across the controller sense pins IINSENSE, VINSENSE is equal to the voltage drop across the shunt resistor as given by $V_{Rsh}=V_{x1}-V_{x2}$.

The input voltage can be sensed as a function of the input current Ix1, Ix2 at one of the controller sense pins IINSENSE, VINSENSE. According to one embodiment, the sense circuitry 112 comprises a circuit 206 such as a feedback amplifier for regulating the voltage at sense nodes (Vx1, Vx2) such that the voltage at the sense nodes remains constant over a range of voltage levels at the input voltage terminal 100 and the current (Ix1, Ix2) through this sense pin is a function of the input voltage Vin. In more detail, the voltage across the level shifting resistors Rx1, Rx2 should be matched, and therefore well-matched current mirrors 202, 204 are used in this embodiment. Also, the input voltage Vin should be level shifted by the correct amount so that the maximum voltage of the controller sense pins IINSEN, VINSEN is not exceeded. As such, the feedback amplifier 206 forces the current (Ix1, Ix2) through one of the level shifting resistors Rx1, Rx2 such that the voltage (Vx1, Vx2) at the corresponding sense pin equals a reference $V_R$ of the feedback amplifier 206. The feedback amplifier 206 can include a current mirror 208 and provide the sensed input voltage (pi_vinsen_out) through a current-to-voltage conversion at one of the controller sense pins IINSEN, VINSEN.

The feedback amplifier 206 can sense the voltage at either the IINSEN pin, the VINSEN pin, or a combination of the two voltages, such that the currents 202 and 204 are adjusted so that the voltages at IINSENS and VINSENS are effectively virtual grounds and match the reference (target) voltage $V_R$. For example according to a first feedback connection configuration, the feedback amplifier 206 regulates the voltage (Vx2) at the sense pin VINSEN to the reference voltage $V_R$ as given by $A_v(V_R-Vx2)$ as shown in FIG. 2. Alternatively, the common mode loop of a differential amplifier 212 can be used to set the common mode of IINSEN and VINSEN such that the common mode equals the target $V_R$. For example according to a second feedback connection configuration, the feedback amplifier 206 can regulate the voltage (pi_iinsen_outn) at one output of the differential amplifier 212 to the reference voltage $V_R$ as given by $A_v(V_R-pi\_iinsen\_outn)$. As such, the differential amplifier 212 can be placed before or after the feedback node of the feedback amplifier 206 such that the feedback node can be connected to either Vx1 or Vx2, or pi_iinsen_outp or pi_iinsen_outn.

According to the embodiment shown in FIGS. 1 and 2, the first terminal of the shunt resistor Rsh is connected to the input voltage terminal 100 of the regulator, the second terminal of the shunt resistor Rsh is connected to the power stage 102 and the controller sense circuitry 112 regulates the voltage at sense pin VINSENSE such that the voltage Vx2 at this sense pin remains constant over a range of voltage levels at the input voltage terminal 100 and the current Ix2 through sense pin VINSEN is a function of the input voltage Vin. That is, the feedback amplifier 206 forces the current Ix2 through the second level shifting resistor Rx2 such that the voltage Vx2 at the controller sense pin VINSEN equals the reference $V_R$ of the feedback amplifier 206. The current Ix2 drawn at sense pin VINSEN to force Vx2=$V_R$ represents the input voltage of the regulator and the feedback amplifier 206 provides the sensed input voltage (pi_vinsen_out) through a current-to-voltage conversion at the controller sense pin VINSEN.

In another embodiment, the controller sense circuitry 112 regulates the voltage at sense pin IINSEN instead of sense pin VINSEN such that the voltage Vx1 at this sense pin remains constant over a range of voltage levels at the input voltage terminal 100 and the current Ix1 through sense pin IINSEN is a function of the input voltage Vin. The feedback amplifier 206 forces current Ix1 through the first level shifting resistor Rx1 such that the voltage Vx1 at the controller sense pin IINSEN equals the reference $V_R$ of the feedback amplifier 206. The current Ix1 drawn at sense pin IINSEN to force $Vx1=V_R$ represents the input voltage (pi_v-insen_out) of the regulator in this case.

In each case, the sense circuitry 112 internal to the regulator controller 104 can also include an analog-to-digital converter (ADC) 210 for digitizing a representation of the current through the sense pin VINSEN, IINSEN whose voltage (Vx2, Vx1) is regulated at a constant level $(V_R)$ by the feedback amplifier 206 as described above. This same or different ADC 210 can be used to digitize a representation of the voltages at both sense pins IINSEN, VINSEN of the controller 104. As previously described herein, the difference between the sense pin voltage (Vx1−Vx2) represents the input current. The controller 104 can further include a differential amplifier 212 configured to amplify the difference between the voltages at the sense pins IINSEN, VINSEN. According to this embodiment, the ADC 210 digitizes the differential outputs (pi_iinsen_outp, pi_iinsen_outn) of the amplifier 212 to yield a digital representation of the measured input current.

In yet another embodiment, the ADC 210 digitizes a representation of a function of the voltages at the sense pins IINSEN, VINSEN whose voltages (Vx2, Vx1) are regulated by the feedback amplifier 206. The function can be an average, sum or weighted sum. For example, the function can be a sum of the voltages as given by $A_v(f(Vx1+Vx2)-V_R)$. As an alternative, a function of the output voltages of the differential amplifier 212 can be regulated by the feedback amplifier 208, such that the common-mode of the output voltages of the differential amplifier 212 are regulated by the feedback amplifier 206 as given by $A_v(f(pi\_iinsen\_outp+pi\_iinsen\_outn)-V_R)$. According to this alternate embodiment, the feedback amplifier 206 regulates some function (e.g. average, sum or weighted sum) of the output voltages pi_iinsen_outp, pi_iinsen_outn of the differential amplifier 212.

Accuracy of the input voltage and input current measurement techniques described heretofore suffer in the presence of mismatch between the level shifting resistors Rx1, Rx2, between the current mirrors 202, 204, and in the presence of internal offset in the amplifier 212, ADC 210, etc. The external mismatch and internal offset decrease the usable range of the controller sense circuitry 112 and therefore adversely impact the accuracy of the input current and input voltage measurements if left unmitigated. The effects can become more pronounced over time e.g. because of component drift, reliability degradation, etc. The controller 104 reduces the effects of external mismatches and internal offsets.

For example, the controller 104 can include a chopping circuit 214 for averaging out the offset between the current Ix1, Ix2 sunk by the current mirrors 202, 204. The input current Iin equals (Vx1−Vx2)/Rsh. Current mirror mismatch introduces an error δIx proportional to the current through the mismatched mirror 202, 204. The error 65x leads to a measurement error as given by Ierr=δIx*Rx/Rsh. Since the input voltage range is small due to the use of a small ohmic shunt resistor Rsh, a small mismatch can lead to a large error. To reduce this error, the chopping circuit 214 includes clocked switches for alternatingly coupling the current mirrors 202, 204 to each of the level shifting resistors Rx1, Rx2 such that effective current measurements for the level shifting resistors RX1, Rx2 average out offset between the current Ix1, Ix2 sunk by the current mirrors 202, 204. Additional chopping circuits can be provided to average out mismatch offsets in other parts of the sense circuitry 112 internal to the regulator controller 104.

In addition or alternatively, the calibration circuitry 114 included in the controller 104 internally compensates for the resistance mismatch between the level shifting resistors Rx1, Rx2 and for internal offset present in the ADC 210 and differential amplifier 212. According to the embodiment illustrated in FIG. 2, the calibration circuitry 114 includes a first resistor ladder 216 and a second resistor ladder 218. The current source circuit (current mirrors 202, 204) of the sense circuitry 112 forces a respective current Ix1, Ix2 through the corresponding level shifting resistor Rx1, Rx2 such that the voltage across the sense pins IINSEN, VINSEN of the controller 104 corresponds to the voltage across the shunt resistor Rsh level shifted down to a lower voltage. The first resistor ladder 216 is electrically connected between sense pin IINSEN and a first node (e.g. current mirror 202) of the current source circuit. The second resistor ladder 218 is electrically connected between sense pin VINSEN and a second node (e.g. current mirror 204) of the current source circuit. The controller 104 selects a tap point of the first resistor ladder 216 via a first multiplexer 220 and a tap point of the second resistor ladder 218 via a second multiplexer 222 for connecting the current source circuit (e.g. current mirrors 202, 204) of the sense circuitry 1112 to the resistor ladders 216, 218. The resistor ladder tap points are selected via the multiplexers 220, 222 so as to compensate for the resistance mismatch between the first and the second level shifting resistors Rx1, Rx and optionally to compensate for the internal offset of the differential amplifier 212 and ADC 210.

The resistor ladder tap points provide the means to introduce an additional offset at the output of the respective resistor ladder multiplexers 220, 222. This additional offset is used to compensate for a resistance mismatch between the first and the second level shifting resistors, Rx1, Rx2, such that the output of the corresponding resistor ladder multiplexer 220/222 has reduced offset. Other embodiments for generating an offset include having programmable current taps to vary the current in a resistor, or a variable resistor element not in a ladder structure, or an amplifier with adjustable input offset. The calibration circuitry 114 may use the embodiment described, or other equivalent embodiments, to provide a compensating offset in order to perform the calibration.

The differential amplifier 212 of the sense circuitry 112 has a first (+) input electrically connected to the first resistor ladder 216 via the first multiplexer 220, and a second (−) input electrically connected to the second resistor ladder 218 via the second multiplexer 222. The regulator input current is sensed through the differential amplifier 212 to amplify the voltage across the shunt resistor Rsh, and the ADC 210 converts the amplified voltage at the output of the amplifier 212 to a digital value ADC_out. However, the external level shifting resistors Rx1, Rx2 introduce an offset dur to mismatch. The resistor ladders 216, 218 connected to the current mirrors 202, 204 of the sense circuit 112 allow the controller 104 to introduce an internal offset which compensates the external offset present because of the mismatch between the level shifting resistors Rx1, Rx2, by selecting the optimum resistor ladder tap point via the respective multiplexers 220, 222.

Each multiplexer 220, 222 of the calibration circuitry 114 is adjustable in increments of one LSB (least significant bit). The LSB of each multiplexer 220, 222 is proportional to the finest resistance adjustment provided by the resistor ladder 216, 218 connected to that multiplexer 220, 222 (R/4 in FIG. 2), and represents the smallest (finest) amount of compensation provided by calibration circuitry 114. The controller 104 changes selection settings (tmuxa_sel<3:0>, tmuxb_sel<3:0>) of the multiplexers 220, 222 during a calibration process until the digital value output by the ADC 210 is within +/−one LSB of zero or until the calibration process is terminated. When the ADC output is within +/−one LSB of zero, the level shifting resistor mismatch reduces the useable range of the ADC 210 by at most 1 LSB, and hence most if not all of the ADC range remains available for input current and voltage measurements.

During calibration, the controller 104 makes measurements of the input network such that the offset introduced by the resistance mismatch between the first and the second level shifting resistors Rx1, Rx2 can be determined by the measurements. The measurements can then be used to introduce an additional compensating offset in the calibration circuitry 114, such as provided by the calibration circuitry 114 or alternate embodiments, such that the compensating offset minimizes the overall offset in the measurement. In some cases, all that is needed is the sign of the offset in order to use a search algorithm or servo loop, to minimize the offset. In other embodiments, the magnitude may be used to determine the required compensating offset.

In one embodiment, the controller 104 includes a counter that is incremented or decremented e.g. via a servo loop if the digital value output by the ADC 210 is outside +/−one LSB of zero during the calibration process, to change the selection settings (tmuxa_sel<3:0>, tmuxb_sel<3:0>) of the multiplexers 220, 222. The controller 104 continues to increment and/or decrement the counter until the digital value output by the ADC 210 is within +/−one LSB of zero or until the calibration process is terminated. In an embodiment, the controller 104 includes a comparator for comparing the ADC output to the LSB. The controller continues changing the multiplexer settings until the ADC output is within +/−1 LSB of zero. The multiplexer settings that yield an ADC output that is within +/−1 LSB of zero best compensate for the Rx mismatch and the internal offset of the differential amplifier 212 and ADC 210. In another embodiment, the controller 104 directly calculates the multiplexer settings (tmuxa_sel<3:0>, tmuxb_sel<3:0>) which yield a digital value at the output by the ADC 210 that is within +/−one LSB of zero.

Figure 3:
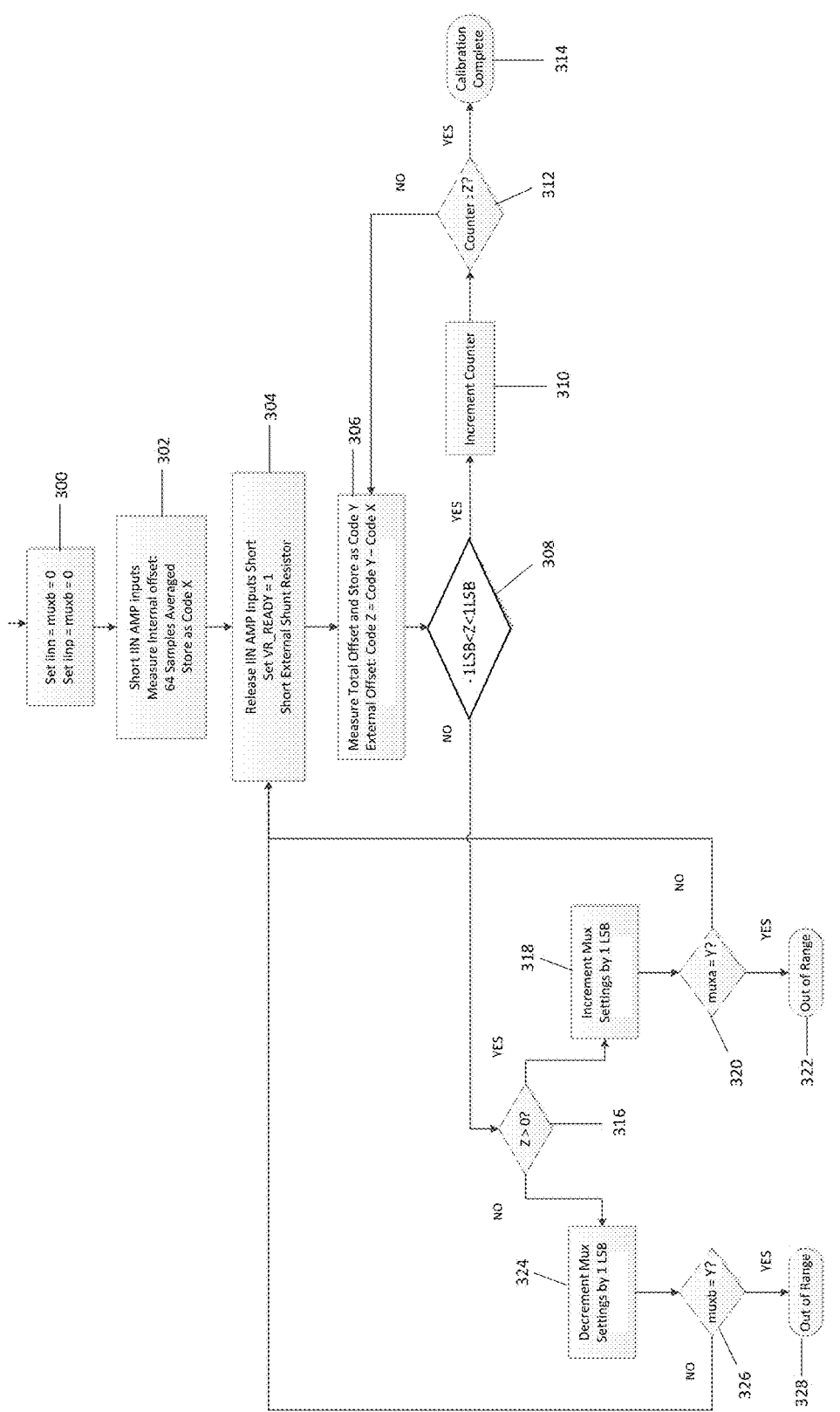
FIG. 3 illustrates a flow diagram of an embodiment of a method of external mismatch and internal offset compensation for a voltage regulator.

FIG. 3 illustrates an embodiment of the calibration process implemented by the regulator controller 104. The multiplexer settings (tmuxa_sel<3:0>, tmuxb_sel<3:0>) are set to an initial (base) value e.g. zero (Block 300). The inputs iinn, iinp to the differential amplifier 212 of the controller sense circuitry 112 are then shorted and the internal offset of the differential amplifier 212 and ADC 210 is measured at the output of the ADC (Block 302). With the amplifier inputs iinn, iinp shorted, the ADC output represents just the offset of the differential amplifier 212 and the ADC 210. The internal offset can be averaged over a number of samples (e.g. 64 samples in FIG. 3) and stored by the controller 104 as Code X (Block 302). The amplifier inputs iinn, iinp are un-shorted after the internal offset is measured, and the external shunt resistor Rsh is shorted (Block 304). The controller 104 does not know the value of the input current Iin when calibrating, and thus removes the Rsh*Iin path during the calibration process by shorting the shunt resistor Rsh.

Figure 4:
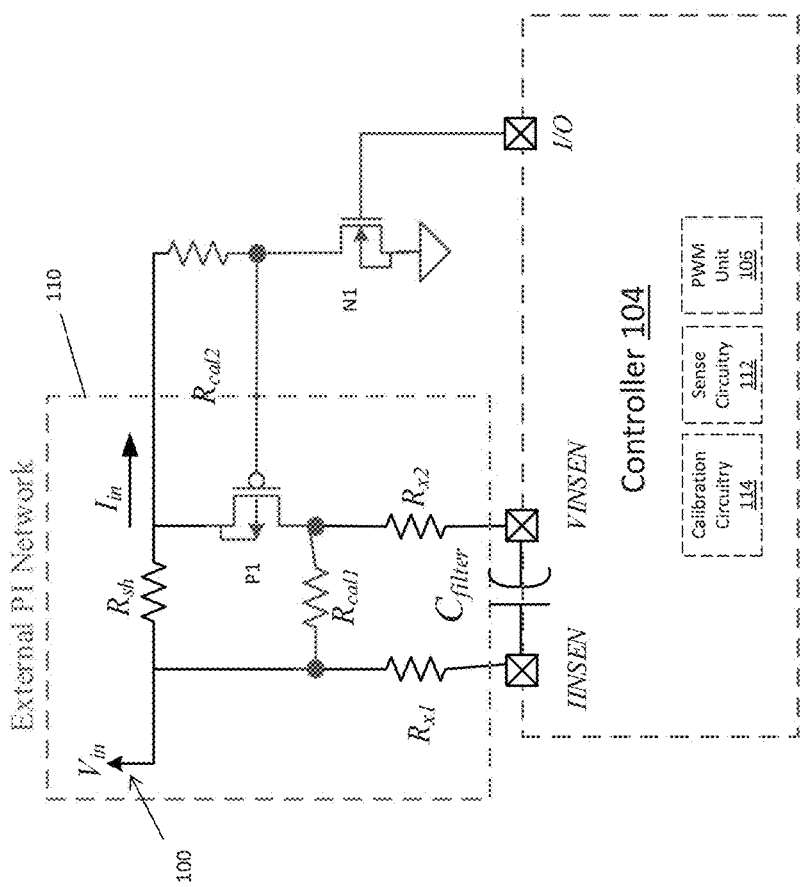
FIG. 4 illustrates a block diagram of an embodiment of the regulator controller with an additional pin for shorting an external shunt resistor during the calibration process.

FIG. 4 illustrates an embodiment of the controller 104 in which the controller 104 includes an additional pin (I/O) that goes high during the calibration process. When this pin is high, NFET N1 is on and pulls the node between NFET N1 and resistor Rcal 2 low, which in turn turns on PFET P1 to connect the Rx1 and Rx2 paths via resistor Rcal 1, thus removing Rsh*Iin from the external PI network 100. This configuration effectively connects both the first and the second level shifting resistors Rx1, Rx2 to the same node, providing input nulling capability such that the voltage offset due to the mismatch of the resistances is seen as the voltage difference across the sense pins IINSEN, VINSEN of the controller 104, independent of the current flowing in the sensor. This allows the offset to be measured by the calibration circuitry 114, such that the offset can be cancelled or minimized.

Figure 5:
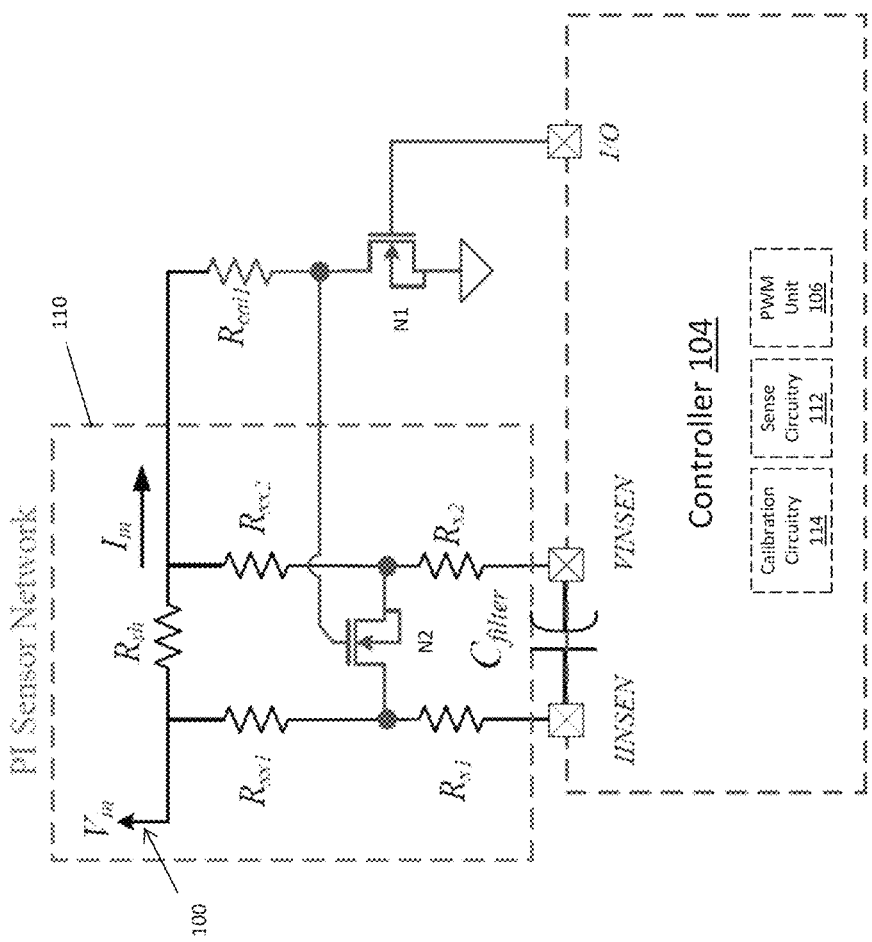
FIG. 5 illustrates a block diagram of another embodiment for shorting the external shunt resistor during the calibration process.

FIG. 5 illustrates an alternate embodiment of the external circuitry for providing input nulling capability. According to this embodiment, a switch N2 is configured to short the sensor inputs IINSEN, VINSEN. To provide the shorting capability, some of the level shifting resistance is not shorted out. Resistors Rxx1 and Rxx2 are typically more than 100× smaller than resistors Rx1 and Rx2. In this way, most of the input current Iin flows through the shunt resistor Rsh during calibration. This configuration can still be effective since most of the resistance is included in the measurement. The mismatch of Rxx1 and Rxx2 should be small and negligible. Other embodiments are possible, including alternate arrangements of NMOS and PMOS switches, such that the offset introduced by the mismatch of level shifting resistors Rx1 and Rx2 is seen across the controller inputs IINSEN, VINSEN.

Returning to the method of FIG. 3, the total offset, which includes the external offset caused by level shifting resistor mismatch and internal offset of the differential amplifier 212 and ADC 210, is measured at the output of the ADC 210 and stored as Code Y by the controller 104 (Block 306). The external offset caused by level shifting resistor mismatch is calculated as Code Z by subtracting Code X (the internal offset) from Code Y (the total offset) (Block 306).

If the external offset (Code Z) is within +/−1 LSB (e.g. +/−6.25 mV in FIG. 3) of zero, after averaging the Code Z calculation over Z samples (Blocks 308, 310, 312), the optimal multiplexer settings which best compensate the mismatch between the external level shifters Rx1, Rx2 have been determined and the calibration process is terminated (Block 314). However, if Code Z is outside +/−1 LSB of zero (Block 308: 'No'), the controller 104 changes the multiplexer selection settings. If Code Z is outside +/−1 LSB and greater than zero, the setting (tmuxa_sel<3:0>) of the first multiplexer 220 is incremented until Code Z falls within +/−1 LSB of zero or all settings (Y) for the first multiplexer 220 have been tried (Blocks 316, 318, 320, 322). If Code Z is outside +/−1 LSB and less than zero, the setting (tmuxb_sel<3:0>) of the second multiplexer 222 is decremented until Code Z falls within +/−1 LSB of zero or all settings for the second multiplexer 220 have been tried (Blocks 316, 324, 326, 328). The calibration process converges on the ideal multiplexer settings i.e. the multiplexer settings which result in Code Z being within +/−1 LSB of zero, or the calibration process can be terminated e.g. by the controller 104 or outside intervention. With the method illustrated in FIG. 3, the controller 104 can select the tap points of the resistor ladders 216, 218 so as to compensate for the resistance mismatch between the first and the second level shifting resistors Rx1, Rx2 and optionally for the internal offset of the amplifier 212 and the ADC 210.

Table 1 illustrates exemplary multiplexer settings for the first (A) and second (B) multiplexers 220, 222. Each resistor ladder 216, 218 has 9 resistance set points ($A_0$-$A_8$, $B_0$-$B_8$), and the resistance delta ($\Delta R$) is shown for each combination of multiplexer settings. The LSB is proportional to Vin*R/4, where R/4 is the finest resistance adjustments provided by the resistor ladders 216, 218. In the example shown in Table 1, R=240Ω, Rx1=100Ω, Rx2=100Ω, Vin=12V, $V_R$=25 mV, and LSB=6.25 mV. Hence, each incremental change in multiplexer settings represents a +/−6.25 mV change and the total adjustment range varies from +143.75 mV to −143.75 mV in this purely illustrative example. Other multiplexer setting granularities and ranges are contemplated and within the scope of the embodiments described herein.

TABLE 1

Exemplary Multiplexer Settings and Voltage Adjustment Options

| ΔR (Ω) | MUX A Setting | MUX B Setting | ΔLevel (mV) | MUX A Level (mV) | MUX B Level (mV) | ΔLevel (mV) |
|---|---|---|---|---|---|---|
| −5.75 | 8 | 0 | −143.75 | 143.75 | 0 | −143.75 |
| −5.5 | 8 | 1 | −137.5 | 143.75 | 6.25 | −137.5 |
| −5.25 | 8 | 2 | −131.25 | 143.75 | 12.5 | −131.25 |
| −5 | 8 | 3 | −125 | 143.75 | 18.75 | −125 |
| −4.75 | 7 | 0 | −118.75 | 118.75 | 0 | −118.75 |
| −4.5 | 7 | 1 | −112.5 | 118.75 | 6.25 | 112.5 |
| −4.25 | 7 | 2 | −106.25 | 118.75 | 12.5 | −106.25 |
| −4 | 7 | 3 | −100 | 118.75 | 18.75 | −100 |
| −3.75 | 6 | 0 | −93.75 | 93.75 | 0 | −93.75 |
| −3.5 | 6 | 1 | −87.5 | 93.75 | 6.25 | −87.5 |
| −3.25 | 6 | 2 | −81.25 | 93.75 | 12.5 | −81.25 |
| −3 | 6 | 3 | −75 | 93.75 | 18.75 | −75 |
| −2.75 | 5 | 0 | −68.75 | 68.75 | 0 | −68.75 |
| −2.5 | 5 | 1 | −62.5 | 68.75 | 6.25 | −62.5 |
| −2.25 | 5 | 2 | −56.25 | 68.75 | 12.5 | −56.25 |
| −2 | 5 | 3 | −50 | 68.75 | 18.75 | −50 |
| −1.75 | 4 | 0 | −43.75 | 43.75 | 0 | −43.75 |
| −1.5 | 4 | 1 | −37.5 | 43.75 | 6.25 | −37.5 |
| −1.25 | 4 | 2 | −31.25 | 43.75 | 12.5 | −31.25 |
| −1 | 4 | 3 | −25 | 43.75 | 18.75 | −25 |
| −0.75 | 3 | 0 | −18.75 | 18.75 | 0 | −18.75 |
| −0.5 | 2 | 0 | −12.5 | 12.5 | 0 | −12.5 |
| −0.25 | 1 | 0 | −6.25 | 6.25 | 0 | 6.25 |
| 0 | 0 | 0 | 0 | 0 | 0 | 0 |
| 0.25 | 0 | 1 | 6.25 | 0 | 6.25 | 6.25 |
| 0.5 | 0 | 2 | 12.5 | 0 | 12.5 | 12.5 |
| 0.75 | 0 | 3 | 18.75 | 0 | 18.75 | 18.75 |
| 1 | 3 | 4 | 25 | 18.75 | 43.75 | 25 |
| 1.25 | 2 | 4 | 31.25 | 12.5 | 43.75 | 31.25 |
| 1.5 | 1 | 4 | 37.5 | 6.25 | 43.75 | 37.5 |
| 1.75 | 0 | 4 | 43.75 | 0 | 43.75 | 43.75 |
| 2 | 3 | 5 | 50 | 18.75 | 68.75 | 50 |
| 2.25 | 2 | 5 | 56.25 | 12.5 | 68.75 | 56.25 |
| 2.5 | 1 | 5 | 62.5 | 6.25 | 68.75 | 62.5 |
| 2.75 | 0 | 5 | 68.75 | 0 | 68.75 | 68.75 |
| 3 | 3 | 6 | 75 | 18.75 | 93.75 | 75 |
| 3.25 | 2 | 6 | 81.25 | 12.5 | 93.75 | 81.25 |
| 3.5 | 1 | 6 | 87.5 | 6.25 | 93.75 | 87.5 |
| 3.75 | 0 | 6 | 93.75 | 0 | 93.75 | 93.75 |
| 4 | 3 | 7 | 100 | 18.75 | 118.75 | 100 |
| 4.25 | 2 | 7 | 106.25 | 12.5 | 118.75 | 106.25 |
| 4.5 | 1 | 7 | 112.5 | 6.25 | 118.75 | 112.5 |
| 4.75 | 0 | 7 | 118.75 | 0 | 118.75 | 118.75 |
| 5 | 3 | 8 | 125 | 18.75 | 143.75 | 125 |
| 5.25 | 2 | 8 | 131.25 | 12.5 | 143.75 | 131.52 |
| 5.5 | 1 | 8 | 137.5 | 6.25 | 143.75 | 137.5 |
| 5.75 | 0 | 8 | 143.75 | 0 | 143.75 | 143.75 |

In Table 1, the range of the ADC 210 can be incrementally offset by +/−6.25 mV and by a total of +/−143.75 mV according to this example, to compensate for mismatch in the external level shifting resistors Rx1, Rx2 and optionally the offset in the differential amplifier 212 and ADC 210. The incremental amount of offset provided by the calibration circuitry 114 depends on several factors, including the finest resistance adjustment provided by the resistor ladders 216, 218 and the value of the input voltage Vin. The resistors of each ladder 216, 218 are internal to the controller 104 i.e. fabricated on the same die as the controller 104. Accordingly, the ladder resistors have good temperature coefficient and better matching than the external level shifting resistors Rx1, Rx2, especially in the case of lower precision (e.g. 1%) discrete external resistors.

Table 2 provides a comparative illustrative with and without compensating for the mismatch between the external level shifting resistors Rx1 and Rx2. The mismatch in the external level shifting resistors Rx1 and Rx2 introduces a voltage offset term Voffset=Ix*dRx, where 'd' represents the resistance mismatch. The voltage offset can be positive or negative. Table 2 shows the 3σ Voffset value for different degrees of mismatch, from 0.1% precision (tolerance) external level shifting resistors to 1% precision external level shifting resistors. Also in this example, the ADC range is 60 mV. The term Ix*dRx can result in a large offset even for well-matched external resistors. For even high precision 0.1% 100 kohm resistors, the mismatch can be 100 ohm. This mismatch yields a 10 mV offset that is subtracted from the overall ADC range of the controller 104. Without the compensating for the Rx mismatch, the external level shifting resistors Rx1, Rx2 Rx must be 0.1% matched to have good ADC range. The offset caused by the Rx mismatch is compensated by the calibration circuitry 114. During the calibration process, the external offset is sensed and compensated by an equal and opposite internal offset. For example, the multiplexer settings (tmuxa_sel<3:0>, tmuxb_sel<3:0>) can be adjusted in increments of 1 LSB (R/4 or ~6 mV in FIGS. 2 and 3) until the measured offset is within +/−1 LSB of 0.

TABLE 2

Example illustration With and Without Rx Mismatch Calibration

| R1/R2 Tolerance (%) | 3σ offset due to R1/R2 Mismatch (mV) | Remaining ADC Range Without RMUX Cal (mV) | ADC Range With RMUX Cal (mV) |
|---|---|---|---|
| 0.1 | 15 | 45 | 60 |
| 0.2 | 30 | 30 | 60 |
| 0.4 | 45 | 15 | 60 |
| 0.4 | 60 | 0 | 60 |
| 0.5 | 74 | 0 | 60 |
| 0.7 | 104 | 0 | 60 |
| 1 | 149 | 0 | 54.75 |

When the input voltage Vin changes, the current Ix scales with (Vin−$V_R$)/(Rx+nR) and the external and internal offsets both scale proportional to the Vin delta. That is, Voffset changes with Vin as follows:

$$V_{offset} = \frac{(V_{in} - V_R) \cdot dR_x}{R_x}; \text{ and} \quad (1)$$

$$\Delta V_{offset} = \frac{\Delta V_{in} \cdot dR_x}{R_x}$$

Hence, the new Voffset' can be derived from the previous Voffset as given by:

$$V'_{offset} = V_{offset} \cdot \frac{V'_{in} - V_R}{V_{in} - V_R} \quad (2)$$

The internal offset of the differential amplifier 212 and ADC 210 similarly scales with Vin as given by:

$$V_{mux} = n \cdot R \cdot \frac{V_{in} - V_R}{R_x}; \text{ and} \quad (3)$$

$$\Delta V_{mux} = \frac{n \cdot R \cdot \Delta V_{in}}{R_x}$$

where 'n' is the LSB of the multiplexers 220, 222 and Vmux is the internal offset. In this way, the calibration process does not have to be redone immediately.

If the Rx1/Rx2 mismatch was not mitigated, the entire useable 60 mV range in the example of Table 2 would be consumed by the mismatch for resistors with 0.4% precision. By selecting the tap points of the resistor ladders 216, 218 so as to compensate for the resistance mismatch between the level shifting resistors Rx1, Rx2 and optionally for the internal offset of the amplifier 212 and the ADC 210, the entire 60 mV range is preserved for level shifting resistors with 0.7% precision. Even for level shifting resistors with 1% precision, 54.75 mV of the original 60 mV range remains available for input current and voltage measurements.

As explained above, instead of using a counter to search for the optimal multiplexer settings, the controller 104 can directly calculate the multiplexer settings (tmuxa_sel<3:0>, tmuxb_sel<3:0>) which yield a digital value at the output by the ADC 210 that is within +/−one LSB of zero. For example, if the voltage offset caused by the mismatch in the external level shifting resistors Rx1 and Rx2 is greater than zero, the controller 104 can calculate the multiplexer settings as follows:

$$tmuxb_{set}\langle 3:0 \rangle = 3 - \frac{V_{offset}\%25}{LSB}; \text{ and} \quad (4)$$

$$tmuxa_{set}\langle 3:0 \rangle = 3 + \frac{V_{offset}}{25}$$

If the voltage offset caused by the mismatch in the external level shifting resistors Rx1 and Rx2 is less than zero, the controller 104 can calculate the multiplexer settings as follows:

$$tmuxa_{set}\langle 3:0 \rangle = 3 - \frac{V_{offset}\%25}{LSB}; \text{ and} \quad (5)$$

$$tmuxb_{set}\langle 3:0 \rangle = 3 + \frac{V_{offset}}{25}$$

The calibration process implemented by the regulator controller can be repeated. For example, the calibration process can be performed each time the output voltage is enabled by the voltage regulator. In addition or alternatively, the calibration process can be performed after certain amount of operating temperature change. Depending on the temperature coefficient of the external level shifting resistors Rx1, Rx2, the mismatch may drift over temperature. Recalibrating accounts for the drift. Temperature telemetry data is readily available to the controller 104 e.g. external and internal die temperature is typically sensed. In one embodiment, the controller 104 reinitiates the calibration process if the temperature telemetry data exceeds a threshold, to re-compensate for the resistance mismatch between the level shifting resistors Rx1, Rx2. In addition or alternatively, the controller 104 can reinitiate the calibration process after a predetermined amount of time lapses, to re-compensate for the resistance mismatch between the level shifting resistors Rx1, Rx2. Depending on the semiconductor technology used to fabricate the controller, the devices (transistors, diodes, resistors, etc.,) included in the controller die may be highly susceptible to stress such as mechanical stress, electrical stress, etc. Hence, the devices may shift over time. Recalibrating for such internal shift accounts for internal stress-induced shift which occurs over time.

The calibration circuitry 114 included in the controller 104 for implementing the calibration process is illustrated in FIG. 2 as a resistor ladder network 216, 218 and corresponding multiplexers 220, 222 for selecting the set points of the respective ladders 216, 218. In another embodiment, the internal resistors (R/4, R/4, R/4, R, R, . . . ) can be implemented as transistors whose gates are controlled directly by the controller 104, instead of using multiplexers, to adjust the offset at the inputs iinn, iinp of the differential amplifier 212 and compensate for external resistor mismatch and internal offsets as previously described herein. According to this embodiment, the controller 104 directly sets the resistance of the first resistor ladder 216 and the resistance of the second resistor ladder 218 of the calibration circuitry 114 so as to compensate for the resistance mismatch between the level shifting resistors Rx1, Rx2, and optionally to compensate for the internal offset of the differential amplifier 212 and the ADC 210.

Figure 6:
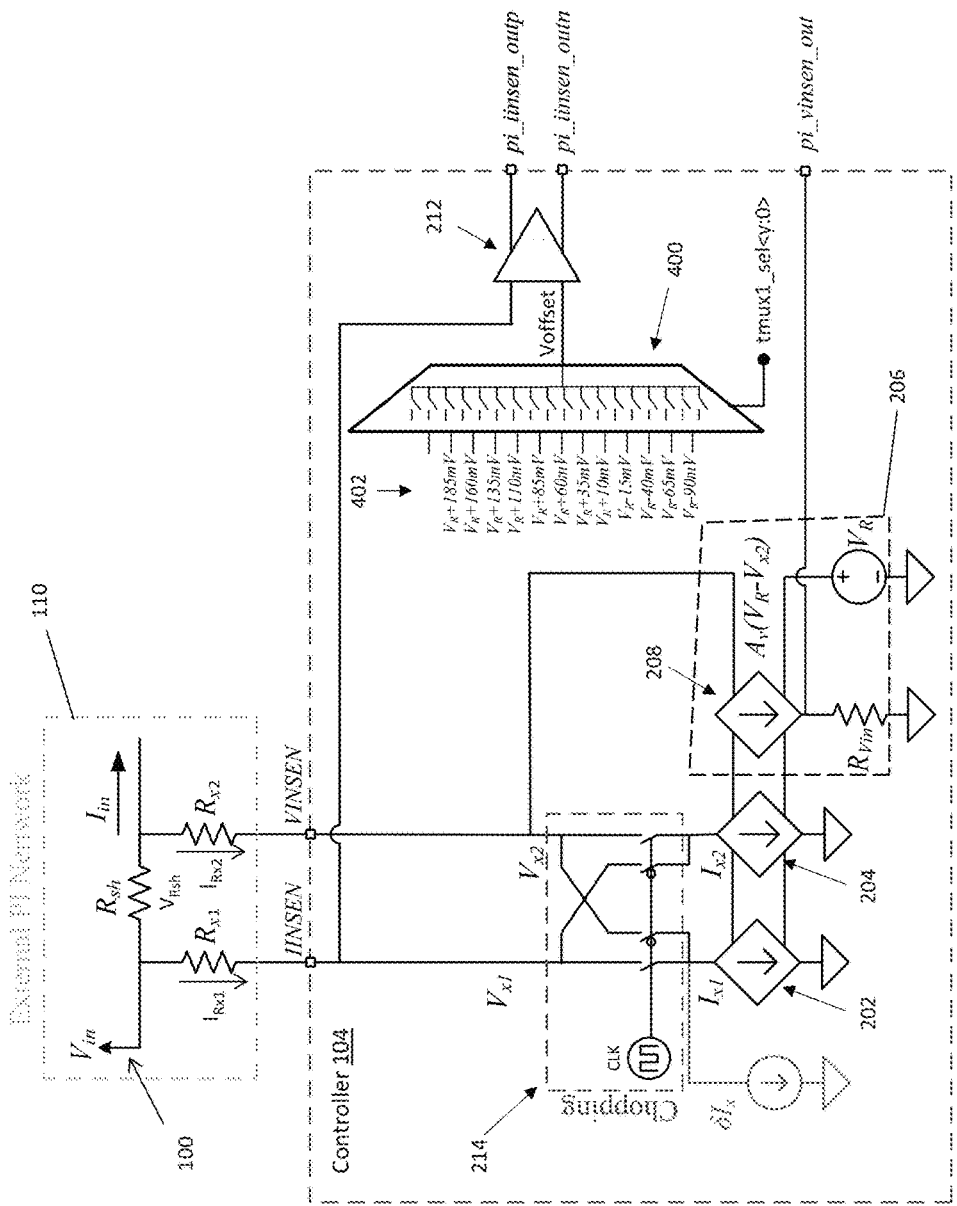
FIG. 6 illustrates a block diagram of another embodiment of the calibration circuitry included in the regulator controller.

FIG. 6 illustrates yet another embodiment of the calibration circuitry 114 included in the regulator controller 104. According to this embodiment, the calibration circuitry 114 includes a multiplexer 400 having a plurality of selectable voltage inputs ($V_R$+/−Y mV) and an output electrically connected to one input of the differential amplifier 212. The other input of the differential amplifier 212 is electrically connected to sense pin IINSEN of the controller 104. The controller 104 changes the selection setting (tmux1_sel<y:0>) of the multiplexer 400 during the calibration process until the digital value output by the ADC 210 (not shown in FIG. 6 for ease of illustration) is at a minimum of the ADC range or until the calibration process is terminated.

If the regulator input voltage Vin changes, the calibration will be off in this embodiment. Hence, the controller 104 reinitiates the calibration process if the input voltage Vin changes, to re-set the digital value output by the ADC 210 at the minimum of the ADC range i.e. +/−1 LSB of zero where the LSB in this embodiment is the smallest (finest) voltage offset available by adjusting the selection setting (tmux1_sel<y:0>) of the multiplexer 400. In addition or alternatively, the controller 104 can reinitiate the calibration process if a temperature sensed by the controller 104 exceeds a threshold and/or after a predetermined amount of time lapses, to re-set the digital value output by the ADC 210 at the minimum of the ADC range.

In more detail, each mirrored current Ix is a function of (Vin−$V_R$)/Rx. The loop implemented by the sense circuitry 112 of the controller 104 attempts to force the sensed input voltage Vinsense to $V_R$, and sets each mirrored current Ix such that Ix equals (Vin−Vinsense)/Rx. So if the input voltage Vin changes, the loop changes Ix to meet this condition. That is, Ix scales with Vin, and the corresponding voltage drop across Rx also scales with Vin. The calibration circuitry embodiment illustrated in FIG. 6 directly introduces voltage offset to the differential amplifier 212, to compensate for external Rx mismatch offset and internal offset in the amplifier 212 and ADC 210. By shifting the amplifier range up or down by changing the settings of the multiplexer 400, the controller 104 implements a servo loop to search for the optimal voltage offset (Voffset) and then adds this offset to the differential amplifier 212. As explained previously herein, voltage $V_R$ is a reference voltage that sets the sensed input voltage Vinsense to $V_R$. The inputs to the multiplexer 400 are a voltage offset ladder 402 generated based on the same reference voltage $V_R$. The step values of the voltage ladder 402 are selected based on the possible input voltage range the regulator can support, and has a fine enough step difference (ΔmV) to meaningfully reduce the effect from Rx resistor mismatch and internal offset.

Figure 7:
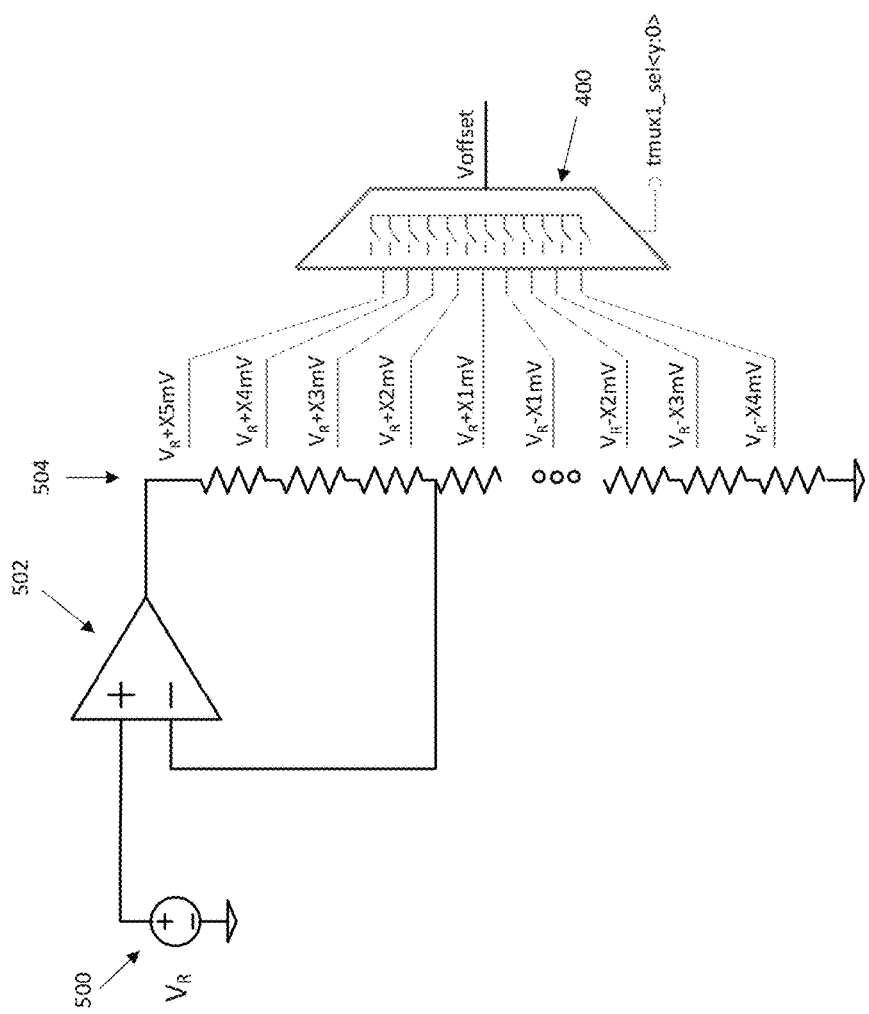
FIG. 7 illustrates a block diagram of an embodiment of a voltage ladder implemented by the controller calibration circuitry shown in FIG. 6.

FIG. 7 illustrates an embodiment of the voltage ladder 402 implemented by the controller calibration circuitry 114. According to this embodiment, voltage $V_R$ is generated from a bandgap voltage 500 and an amplifier 502 with a resistor network 504 on its output. Multiple voltages can be tapped from the resistor ladder 504 to provide different step values ($V_R$+/−X mV) selectable by choosing the corresponding selection setting (tmux1_sel<y:0>) of the multiplexer 400.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage regulator, comprising:
   an input voltage terminal;
   a power stage configured to produce an output voltage from an input voltage at the input voltage terminal;
   a controller operable to control switching of the power stage to regulate the output voltage;
   a shunt resistor connected in series between the input voltage terminal and the power stage;
   a first level shifting resistor connected in series between a first terminal of the shunt resistor and a first sense pin of the controller; and
   a second level shifting resistor connected in series between a second terminal of the shunt resistor and a second sense pin of the controller;
   wherein the controller comprises:
      a third level shift resistor electrically connected to the first sense pin;
      a fourth level shift resistor electrically connected to the second sense pin, at least one of the third and the fourth level shift resistors having a variable resistance;
      sense circuitry operable to sense the input current of the regulator as a function of a voltage difference across a terminal of the third resistor and a terminal of the fourth resistor; and
      calibration circuitry operable to internally compensate for a resistance mismatch between the first and the second level shifting resistors, by varying the resistance of at least one of the third and the fourth level shifting resistors internal to the controller.

2. The voltage regulator of claim 1, wherein the third level shift resistor comprises a first resistor ladder electrically connected to the first sense pin and the fourth level shift resistor comprises a second resistor ladder electrically connected to the second sense pin, and wherein the controller is operable to select a tap point of the first resistor ladder and a tap point of the second resistor ladder for connecting the sense circuitry to the first and the second resistor ladders, the tap points being selected so as to compensate for the resistance mismatch between the first and the second level shifting resistors.

3. The voltage regulator of claim 2, wherein the sense circuitry comprises a current source circuit operable to force a current through the first and the second level shifting resistors such that the voltage across the first and the second sense pins corresponds to the voltage across the shunt resistor level shifted down to a lower voltage, wherein the first resistor ladder is electrically connected between the first sense pin and a first node of the current source circuit, and wherein the second resistor ladder is electrically connected between the second sense pin and a second node of the current source circuit.

4. The voltage regulator of claim 2, wherein the sense circuitry comprises:
   an amplifier having a first input electrically connected to the first resistor ladder and a second input electrically connected to the second resistor ladder, the amplifier operable to amplify the voltage measured across the sense pins at an output of the amplifier; and
   an ADC (analog-to-digital converter) operable to convert the amplified voltage at the output of the amplifier to a digital value.

5. The voltage regulator of claim 4, wherein the controller is operable to determine an internal offset of the amplifier and the ADC, and wherein the controller is operable to select the tap point of the first resistor ladder and the tap point of the second resistor ladder so as to compensate for the resistance mismatch between the first and the second level shifting resistors and for the internal offset of the amplifier and the ADC.

6. The voltage regulator of claim 4, wherein the first input of the amplifier is electrically connected to the first resistor ladder through a first multiplexer, wherein the second input of the amplifier is electrically connected to the second resistor ladder through a second multiplexer, wherein each multiplexer is adjustable in increments of one LSB (least significant bit), wherein the LSB of each multiplexer is proportional to the finest resistance adjustment provided by the resistor ladder connected to that multiplexer, and wherein the controller is operable to change selection settings of the first and the second multiplexers during a calibration process until the digital value output by the ADC is within +/−one LSB of zero or until the calibration process is terminated.

7. The voltage regulator of claim 6, wherein the controller is operable to increment or decrement a counter if the digital value output by the ADC is outside +/−one LSB of zero, to change the selection settings of the first and the second multiplexers.

8. The voltage regulator of claim 6, wherein the controller is operable to calculate the multiplexer settings which yield a digital value at the output by the ADC that is within +/−one LSB of zero.

9. The voltage regulator of claim 2, wherein the controller is operable to short the shunt resistor during a calibration process.

10. The voltage regulator of claim 1, wherein the controller is operable to reinitiate a calibration process if a temperature sensed by the controller exceeds a threshold, to re-compensate for the resistance mismatch between the first and the second level shifting resistors.

11. The voltage regulator of claim 1, wherein the controller is operable to reinitiate a calibration process after a predetermined amount of time lapses, to re-compensate for the resistance mismatch between the first and the second level shifting resistors.

12. The voltage regulator of claim 1, wherein the third level shift resistor comprises a first resistor ladder electrically connected to the first sense pin and the fourth level shift resistor comprises a second resistor ladder electrically connected to the second sense pin, and wherein the controller is operable to set a resistance of the first resistor ladder and a resistance of the second resistor ladder so as to compensate for the resistance mismatch between the first and the second level shifting resistors.

13. The voltage regulator of claim 1,
wherein the calibration circuitry comprises a multiplexer having an output and a plurality of selectable voltage inputs,
wherein the sense circuitry comprises:
an amplifier having a first input electrically connected to the output of the multiplexer and a second input electrically connected to the first sense pin; and
an ADC (analog-to-digital converter) having an ADC range and operable to convert an amplified output of the amplifier to a digital value,
wherein the controller is operable to change a selection setting of the multiplexer during a calibration process until the digital value output by the ADC is at a minimum of the ADC range or until the calibration process is terminated.

14. The voltage regulator of claim 13, wherein the controller is operable to reinitiate the calibration process if a temperature sensed by the controller exceeds a threshold, to re-set the digital value output by the ADC at the minimum of the ADC range.

15. The voltage regulator of claim 13, wherein the controller is operable to reinitiate the calibration process after a predetermined amount of time lapses, to re-set the digital value output by the ADC at the minimum of the ADC range.

16. The voltage regulator of claim 13, wherein the controller is operable to reinitiate the calibration process if the input voltage changes, to re-set the digital value output by the ADC at the minimum of the ADC range.

17. A method of sensing input current of a voltage regulator that includes an input voltage terminal, a power stage for producing an output voltage from an input voltage at the input voltage terminal, a shunt resistor connected in series between the input voltage terminal and the power stage, a first level shifting resistor connected in series between a first terminal of the shunt resistor and a first sense pin of a controller, and a second level shifting resistor connected in series between a second terminal of the shunt resistor and a second sense pin of the controller, the method comprising:
electrically connecting a third level shift resistor, which is internal to the controller, to the first sense pin;
electrically connecting a fourth level shift resistor, which is internal to the controller, to the second sense pin, at least one of the third and the fourth level shift resistors having a variable resistance;
sensing the input current of the regulator as a function of a voltage difference across a terminal of the third resistor and a terminal of the fourth resistor; and
internally compensating within the controller for a resistance mismatch between the first and the second level shifting resistors, by varying the resistance of at least one of the third and the fourth level shifting resistors internal to the controller.

18. The method of claim 17, wherein the third level shift resistor comprises a first resistor ladder electrically connected to the first sense pin and the fourth level shift resistor comprises a second resistor ladder electrically connected to the second sense pin, and wherein internally compensating within the controller for the resistance mismatch between the first and the second level shifting resistors comprises:
selecting a tap point of the first resistor ladder and a tap point of the second resistor ladder for connecting the sense circuitry to the first and the second resistor ladders, the tap points being selected so as to compensate for the resistance mismatch between the first and the second level shifting resistors.

19. The method of claim 18, wherein the controller comprises an amplifier having a first input electrically connected to the first resistor ladder and a second input electrically connected to the second resistor ladder, and an ADC (analog-to-digital converter) for convert an amplified output of the amplifier to a digital value, and the method further comprising:
determining an internal offset of the amplifier and the ADC; and
selecting the tap point of the first resistor ladder and the tap point of the second resistor ladder so as to compensate for the resistance mismatch between the first and the second level shifting resistors and for the internal offset of the amplifier and the ADC.

20. The method of claim 18, wherein the first input of the amplifier is electrically connected to the first resistor ladder through a first multiplexer, wherein the second input of the amplifier is electrically connected to the second resistor ladder through a second multiplexer, wherein each multiplexer is adjustable in increments of one LSB (least significant bit), wherein the LSB of each multiplexer is proportional to the finest resistance adjustment provided by the resistor ladder connected to that multiplexer, and wherein setting the resistance of the first resistor ladder and the resistance of the second resistor ladder so as to compensate for the resistance mismatch between the first and the second level shifting resistors comprises:

changing selection settings of the first and the second multiplexers during a calibration process until the digital value output by the ADC is within +/−one LSB of zero or until the calibration process is terminated.

21. The method of claim 17, wherein the controller comprises a multiplexer having an output and a plurality of selectable voltage inputs, an amplifier having a first input electrically connected to the output of the multiplexer and a second input electrically connected to the first sense pin, and an ADC (analog-to-digital converter) having an ADC range and operable to convert an amplified output of the amplifier to a digital value, and wherein internally compensating within the controller for the resistance mismatch between the first and the second level shifting resistors comprises:
changing a selection setting of the multiplexer during a calibration process until the digital value output by the ADC is at a minimum of the ADC range or until the calibration process is terminated.

22. A voltage regulator controller, comprising:
a first sense pin configured for series connection to a first level shifting resistor connected to a first terminal of a shunt resistor;
a second sense pin configured for series connection to a second level shifting resistor connected to a second terminal of the shunt resistor;
a third level shift resistor electrically connected to the first sense pin;
a fourth level shift resistor electrically connected to the second sense pin, at least one of the third and the fourth level shift resistors having a variable resistance;
sense circuitry operable to sense input current as a function of a voltage difference across a terminal of the third resistor and a terminal of the fourth resistor; and
calibration circuitry operable to internally compensate for a resistance mismatch between the first and the second level shifting resistors, by varying the resistance of at least one of the third and the fourth level shifting resistors internal to the controller.

23. The voltage regulator controller of claim 22, wherein the third level shift resistor comprises a first resistor ladder electrically connected to the first sense pin and the fourth level shift resistor comprises a second resistor ladder electrically connected to the second sense pin, and wherein the controller is operable to select a tap point of the first resistor ladder and a tap point of the second resistor ladder for connecting the sense circuitry to the first and the second resistor ladders, the tap points being selected so as to compensate for the resistance mismatch between the first and the second level shifting resistors.

24. The voltage regulator controller of claim 23, wherein the sense circuitry comprises a current source circuit operable to force a current through the first and the second level shifting resistors such that the voltage across the first and the second sense pins corresponds to the voltage across the shunt resistor level shifted down to a lower voltage, wherein the first resistor ladder is electrically connected between the first sense pin and a first node of the current source circuit, and wherein the second resistor ladder is electrically connected between the second sense pin and a second node of the current source circuit.

25. The voltage regulator controller of claim 23, wherein the sense circuitry comprises:
an amplifier having a first input electrically connected to the first resistor ladder and a second input electrically connected to the second resistor ladder, the amplifier operable to amplify the voltage measured across the sense pins at an output of the amplifier; and
an ADC (analog-to-digital converter) operable to convert the amplified voltage at the output of the amplifier to a digital value.

26. The voltage regulator controller of claim 25, wherein the calibration circuitry is operable to determine an internal offset of the amplifier and the ADC, and select the tap point of the first resistor ladder and the tap point of the second resistor ladder so as to compensate for the resistance mismatch between the first and the second level shifting resistors and for the internal offset of the amplifier and the ADC.

27. The voltage regulator controller of claim 25, wherein the first input of the amplifier is electrically connected to the first resistor ladder through a first multiplexer, wherein the second input of the amplifier is electrically connected to the second resistor ladder through a second multiplexer, wherein each multiplexer is adjustable in increments of one LSB (least significant bit), wherein the LSB of each multiplexer is proportional to the finest resistance adjustment provided by the resistor ladder connected to that multiplexer, and wherein the calibration circuitry is operable to change selection settings of the first and the second multiplexers during a calibration process until the digital value output by the ADC is within +/−one LSB of zero or until the calibration process is terminated.

28. The voltage regulator controller of claim 22,
wherein the calibration circuitry comprises a multiplexer having an output and a plurality of selectable voltage inputs,
wherein the sense circuitry comprises:
an amplifier having a first input electrically connected to the output of the multiplexer and a second input electrically connected to the first sense pin; and
an ADC (analog-to-digital converter) having an ADC range and operable to convert an amplified output of the amplifier to a digital value,
wherein the calibration circuitry is operable to change a selection setting of the multiplexer during a calibration process until the digital value output by the ADC is at a minimum of the ADC range or until the calibration process is terminated.

* * * * *